(12) United States Patent
Ryding et al.

(10) Patent No.: US 7,479,644 B2
(45) Date of Patent: Jan. 20, 2009

(54) ION BEAM DIAGNOSTICS

(75) Inventors: Geoffrey Ryding, Manchester, MA (US); Takao Sakase, Rowley, MA (US); Marvin Farley, Ipswich, MA (US); Theodore Smick, Essex, MA (US)

(73) Assignee: Applied Materials, Inc., Santa Clara, CA (US)

( * ) Notice: Subject to any disclaimer, the term of this patent is extended or adjusted under 35 U.S.C. 154(b) by 278 days.

(21) Appl. No.: 11/589,156

(22) Filed: Oct. 30, 2006

(65) Prior Publication Data

US 2008/0142727 A1    Jun. 19, 2008

(51) Int. Cl.
*H01J 37/317*    (2006.01)
*H01L 21/265*    (2006.01)

(52) U.S. Cl. .............. 250/491.1; 250/489; 250/492.21; 250/397; 250/398

(58) Field of Classification Search .............. 250/491.1, 250/489, 492.21, 397, 398
See application file for complete search history.

(56) References Cited

U.S. PATENT DOCUMENTS 5,811,823 A * 9/1998 Blake et al. ............ 250/492.21
2005/0191409 A1 * 9/2005 Murrell et al. ................ 427/8

* cited by examiner

*Primary Examiner*—Nikita Wells
(74) *Attorney, Agent, or Firm*—Boult Wade & Tennant

(57) ABSTRACT

This invention relates to a method of measuring a property of an ion beam, for example an ion beam current profile or the emittance of an ion beam. A Faraday array comprising an array of ion beam current sensors is employed. The array can provide an ion beam current profile at the plane of the array. The Faraday array is also used in conjunction with an occluding element that may be moved through the ion beam upstream of the Faraday array, there obscuring varying portions of the ion beam from the Faraday array. Suitable manipulation of the signals from the Faraday allows the ion beam current profile to be determined for the plane of the occluding element, and also for the emittance of the ion beam at the plane of the occluding element to be determined.

32 Claims, 6 Drawing Sheets

ION BEAM DIAGNOSTICS

FIELD OF THE INVENTION

This invention relates to an ion implanter and to a method of measuring a property of an ion beam. The property may be, for example, the ion beam current or the emittance.

BACKGROUND OF THE INVENTION

Ion implanters are well known and generally conform to a common design as follows. An ion source produces a mixed beam of ions from a precursor gas or the like. Only ions of a particular species are usually required for implantation in a substrate, for example a particular dopant for implantation in a semiconductor wafer. The required ions are selected from the mixed ion beam using a mass-analysing magnet in association with a mass-resolving slit. Hence, an ion beam containing almost exclusively the required ion species emerges from the mass-resolving slit to be transported to a process chamber where the ion beam is incident on a substrate held in place in the ion beam path by a substrate holder.

Often, the cross-sectional profile of the ion beam is smaller than the substrate to be implanted. For example, the ion beam may be a ribbon beam smaller than the substrate in one axial direction or a spot beam smaller than the substrate in both axial directions. In order to ensure ion implantation across the whole of the substrate, the ion beam and substrate are moved relative to one another such that the ion beam scans the entire substrate surface. This may be achieved by (a) deflecting the ion beam to scan across the substrate that is held in a fixed position, (b) mechanically moving the substrate whilst keeping the ion beam path fixed or (c) a combination of deflecting the ion beam and moving the substrate. For a spot beam, relative motion is generally effected such that the ion beam traces a raster pattern on the substrate.

Our U.S. Pat. No. 6,956,223 describes an ion implanter of the general design described above.

To achieve a desired implant within the tight tolerances now required by the semiconductor industry requires very good control of the ion beam through the ion implanter, right up to the point of incidence on the wafer being implanted. As a result, it is desirable to know the properties of the ion beam at one or more points along its path through the ion implanter. In particular, it is useful to have a measure of the intensity of the ion beam across its cross-section (often measured as the ion beam current) and the spread of directions of ions in the cross-section of the ion beam, generally known as the emittance. Emittance is a measure of the confusion of the beam, i.e. how much angular variation exists within the ion beam. For an ideal ion beam, the angular variation is minimal and so emittance is low.

Emittance is often represented graphically as shown in FIG. 1. Distance from the centre of the ion beam is plotted as the y co-ordinate on the abscissa and y', the measured angle from the longitudinal axis, is plotted on the ordinate. FIG. 1 shows a plot for a typical, diverging ion beam that produces a diagonal from lower left to upper right on such a plot. In this graph, the crosses indicate values obtained, i.e. an angle y' measured for a particular position in the beam y. As can be seen, the crosses generally describe an ellipse. A slice taken vertically through any particular y value provides the range of angles of ions at that particular position in the ion beam. Hence, the wider the ellipse, the larger the spread in angles and so the greater the confusion in the ion beam.

It is also useful to measure not only angles at different positions in the ion beam, but also the intensity that angle contributes. Such measurements allow contour plots like that shown in FIG. 2 to be realised, which provide a convenient presentation of detailed information relating to the emittance of the ion beam. FIG. 2 shows a diverging ion beam with most of its intensity at its centre. Hence, the contours that indicate intensity define an elongate hill that extends from lower left to upper right.

SUMMARY OF THE INVENTION

Against this background, and from a first aspect, the present invention resides in an ion implanter comprising: an ion source operable to produce an ion beam; ion optics operable to guide the ion beam along an ion beam path; an array of sensors with an associated holder for holding the array of sensors in the ion beam path, each sensor being operable to measure an ion beam current incident thereon; a moveable element positioned upstream of the array of sensors; and an actuator arranged to move the moveable element across the ion beam path thereby to allow different portions of the ion beam to be revealed to the array of sensors as the moveable element cuts through the ion beam.

The holder for holding the array of sensors in the ion beam path may be arranged to hold the array in a fixed position or the holder may be moveable so as to allow the array to be moved into and out of the ion beam path.

The moveable element may allow different portions of the ion beam to be revealed to the array of sensors in different ways. For example, the moveable elements may be driven through the ion beam so as to occlude progressively the ion beam. Alternatively, the moveable element may be driven so as to uncover progressively the ion beam. An edge, preferably linear, may be provided on the moveable element. A further arrangement is for the moveable element to comprise a screen with an aperture provided therein. The screen may then be used to occlude the bulk of the ion beam, the aperture allowing a small part of the ion beam to continue to the array of sensors. The moveable element may then be driven through the ion beam to allow different parts of the ion beam to reach the array of sensors.

Allowing different portions of an ion beam to reach an array of sensors provides a flexible arrangement for determining properties of the ion beam to be measured. Also, data provided by the array of sensors may be manipulated in different ways to allow different properties of the ion beam to be determined.

Optionally, the array of sensors comprises a linear array of sensors, and the actuator is arranged to move the moveable element in the direction of the length of the linear array. This arrangement allows a determination of how the portion of the ion beam incident on the array varies as the moveable element is driven through the ion beam. Where the moveable element comprises an elongate aperture, the aperture may be advantageously elongate in a direction substantially normal to the length of the linear array. Where the moveable element comprises an edge presented so as to cut through the ion beam as the actuator moves the moveable element across the ion beam path, the edge may be advantageously aligned substantially normal to the length of the linear array of sensors. Alternatively, the aperture or edge may be aligned with the length of the linear array of sensors.

Preferably, the array of sensors comprises a two-dimensional array, optionally arranged linearly in rows and columns. The moveable member may be moveable both in the direction of the rows and the direction of the columns. This may be achieved using a further actuator, or both movements may be effected using a single actuator.

The moveable element may comprise a pair of elongate apertures, one aperture being elongate in the direction of the rows of sensors and the other aperture being elongate in the direction of the columns of sensors. Alternatively, the ion implanter may comprise one moveable element having an aperture elongate in the direction of the rows of sensors and that is moveable in the direction of the columns, and another moveable element, positioned upstream of the array of sensors, and having an aperture elongate in the direction of the columns and being moveable in the direction of the rows.

Alternatively, the moveable element may comprise a pair of linear edges, one aligned with the rows of sensors and the other aligned with the columns of sensors, the edges being presented such that one edge cuts through the ion beam as the actuator moves the moveable element across the ion beam path in one direction and the other edge cuts through the ion beam as the actuator moves the moveable element across the ion beam path in the other direction.

The sensors may take many different forms, although Faraday cups are preferred.

The moveable member and array of sensors may be placed strategically along the ion beam path through the ion implanter. For example, the ion implanter may further comprise a mass-analysing magnet, and the moveable member may be positioned upstream of the mass-analysing magnet and the array of sensors may be positioned downstream of the mass-analysing magnet. A further possibility is where the ion implanter further comprises a quadrupole ion lens, the moveable member being positioned upstream of the quadrupole ion lens and the array of sensors being positioned downstream of the quadrupole ion lens.

From a second aspect, the present invention resides in a method of measuring an ion beam in an ion implanter comprising an ion source, ion optics an occluding element and an array of sensors, the method comprising: generating an ion beam using the ion source; using the ion optics to guide the ion beam through the ion implanter to impinge on the array of sensors; moving the occluding element through the ion beam upstream of the array of sensors so as to allow different portions of the ion beam to reach the array of sensors; and using each sensor to measure the ion beam current incident thereon at a series of known measuring positions of the occluding element in the ion beam.

Optionally, the array of sensors comprises a linear array, and the method comprises moving the occluding element through the ion beam in the direction of the length of the linear array.

In a contemplated embodiment, moving the occluding element comprises driving an elongate aperture of the occluding element though the ion beam, wherein the aperture is elongate substantially normal to the length of the linear array, the aperture allowing ions from a sampled portion of the ion beam to pass, and wherein measuring the ion beam current at each measuring position with each sensor provides current values for the sampled portion of the ion beam. By "sampled portion of the ion beam", we mean the portion of the ion beam of present interest. In this embodiment that uses an aperture, it is the portion of the ion beam that passes through that aperture that corresponds to the sampled portion.

In another contemplated embodiment, moving the occluding element comprises driving an edge of the occluding element through the ion beam, wherein the edge is aligned substantially normal to the length of the linear array, the occluding element allowing ions from a fraction of the ion beam to pass, and wherein measuring the ion beam current at each measuring position with each sensor provides current values for the fraction of the ion beam.

It should be noted that the "fraction of the ion beam" is not the same as the "sampled portion of the ion beam". The "fraction" is meant as the part of the ion beam that is presently allowed to pass by the occluding element to the array of sensors. As noted above, the "sampled portion of the ion beam" refers to the portion of the ion beam of present interest. When driving an edge through the ion beam, the portion of the ion beam of present interest is actually the part of the ion beam either just covered or just uncovered by the movement of the occluding element from the previous measuring position to the present measuring position. Current values may still be obtained for the sampled portion by using differences between the values of the fraction of the ion beam obtained at the previous measuring position and the present measuring position.

For example, the method may comprise moving the occluding element to uncover progressively the ion beam, and subtracting the current values for the fraction of the ion beam obtained at the previous measuring position from the present measuring position thereby obtaining current values for a sampled portion of the ion beam corresponding to the portion of the ion beam uncovered by moving the occluding element from the previous measuring position to the present measuring position. Alternatively, the method may comprise moving the occluding element to cover progressively the ion beam, in which case the current values for the fraction of the ion beam obtained at the present measuring position should be subtracted from the values for the previous measuring position.

Whether edges or apertures are used when occluding the ion beam, the method may further comprise summing the current values for the sampled portion of the ion beam at each measurement position to obtain a series of total current values for the sampled portion of the ion beam at each measurement position. The total current values may be presented as a profile of the ion beam current at the plane of the occluding element. A further optional technique comprises using the current values for the sampled portion of the ion beam at each measuring position to identify the sensors receiving current at each measuring position, and using a measured position of the occluding element to determine the angle of divergence or convergence of ions reaching each sensor receiving current. The determined angles for each measuring position may be presented as an emittance plot of the ion beam, for example like that shown in FIG. 1. In addition, the current values for the sampled portion of the ion beam from each sensor may be used to present a contour plot of the emittance of the ion beam, for example like that shown in FIG. 2.

To allow profiling in two directions through the ion beam, the array of sensors may comprise a series of linear arrays, each linear array forming a row of a two-dimensional array of sensors arranged into rows and columns. Then, the above methods may be repeated while moving the occluding element through the ion beam in the direction of the length of the columns of sensors. This will provide information on the ion beam both in the direction of the rows of sensors and the direction of the columns of sensors. The method may further comprise treating the two-dimensional array of sensors as a one-dimensional array when moving the occluding element by either (a) adding the current values received by the sensors in each row when the occluding element is being moved in the direction of the columns or (b) adding the current values received by the sensors in each column when the occluding element is being moved in the direction of the rows.

The present invention also extends to controller for an ion implanter, and to a computer, computer program and computer readable medium, all relating to implementing the above methods.

BRIEF DESCRIPTION OF THE DRAWINGS

In order that the present invention may be better understood, a preferred embodiment will now be described with reference to the accompanying drawings, in which.

DETAILED DESCRIPTION OF THE INVENTION

Figure 3:
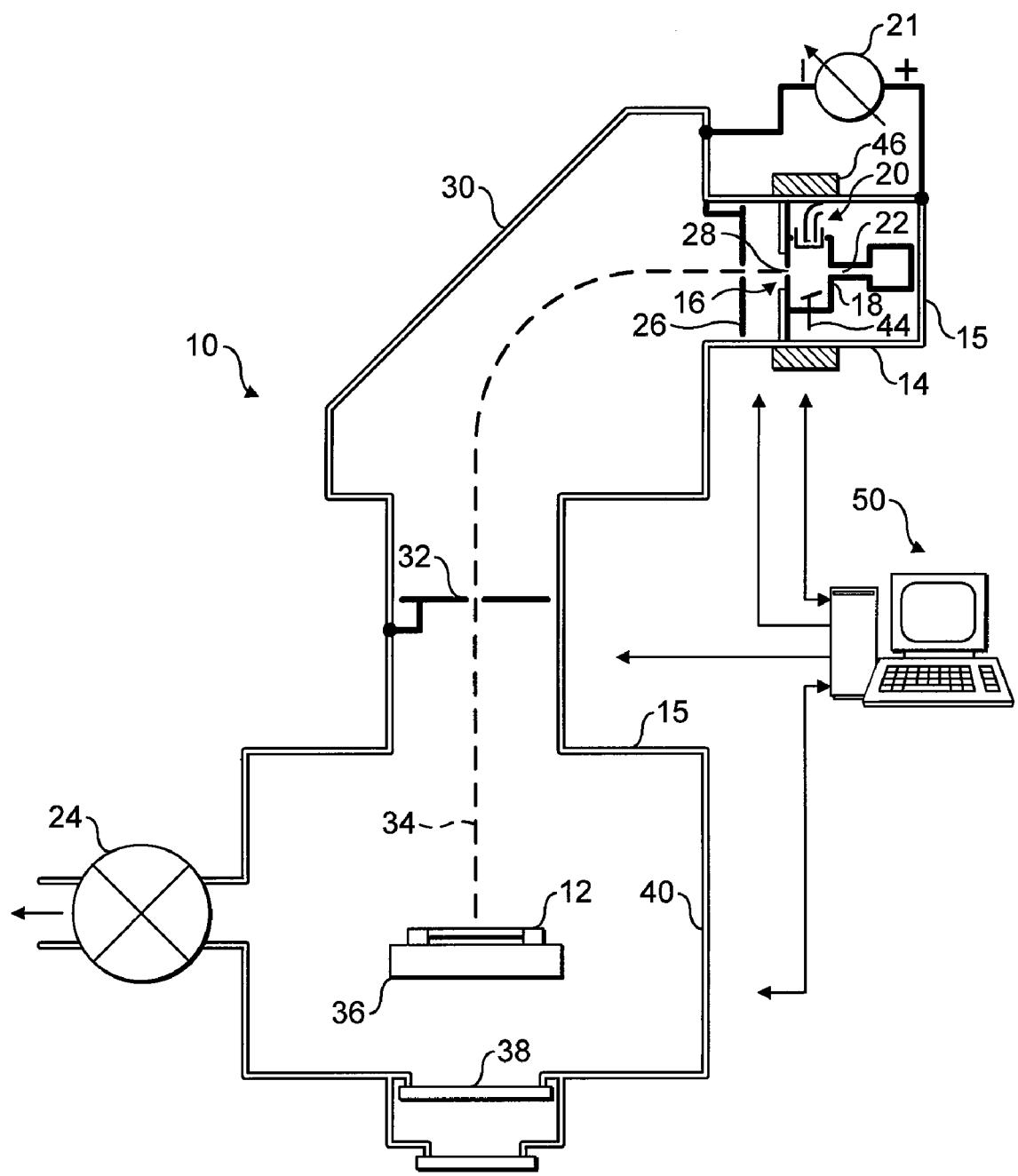
FIG. 3 is a schematic representation of a conventional ion implanter.

In order to provide a context for the present invention, an exemplary application is shown in FIG. 3, although it will be appreciated that this is merely an example of an application of the present invention and is in no way limiting.

FIG. 3 shows a known ion implanter 10 for implanting ions in semiconductor wafers 12. Ions are generated by the ion source 14 to be extracted and follow an ion path 34 that passes, in this embodiment, through a mass analysis stage 30. Ions of a desired mass are selected to pass through a mass-resolving slit 32 and then to strike the semiconductor wafer 12.

The ion implanter 10 contains an ion source 14 for generating an ion beam of a desired species that is located within a vacuum chamber 15 evacuated by pump 24. The ion source 14 generally comprises an arc chamber 16 containing a cathode 20 located at one end thereof. The ion source 14 may be operated such that an anode is provided by the walls 18 of the arc chamber 16. The cathode 20 is heated sufficiently to generate thermal electrons.

Thermal electrons emitted by the cathode 20 are attracted to the anode, the adjacent chamber walls 18 in this case. The thermal electrons ionise gas molecules as they traverse the arc chamber 16, thereby forming a plasma and generating the desired ions.

The path followed by the thermal electrons may be controlled to prevent the electrons merely following the shortest path to the chamber walls 18. A magnet assembly 46 provides a magnetic field extending through the arc chamber 16 such that thermal electrons follow a spiral path along the length of the arc chamber 16 towards a counter-cathode 44 located at the opposite end of the arc chamber 16.

A gas feed 22 fills the arc chamber 16 with the species to be implanted or with a precursor gas species. The arc chamber 16 is held at a reduced pressure within the vacuum chamber 15. The thermal electrons travelling through the arc chamber 16 ionise the gas molecules present in the arc chamber 16 and may also crack molecules. The ions (that may comprise a mixture of ions) created in the plasma will also contain trace amounts of contaminant ions (e.g. generated from the material of the chamber walls 18).

Ions from within the arc chamber 16 are extracted through an exit aperture 28 provided in a front plate of the arc chamber 16 using a negatively-biased (relative to ground) extraction electrode 26. A potential difference is applied between the ion source 14 and the following mass analysis stage 30 by a power supply 21 to accelerate extracted ions, the ion source 14 and mass analysis stage 30 being electrically isolated from each other by an insulator (not shown).

The mixture of extracted ions are then passed through the mass analysis stage 30 so that they pass around a curved path under the influence of a magnetic field. The radius of curvature travelled by any ion is determined by its mass, charge state and energy, and the magnetic field is controlled so that, for a set beam energy, only those ions with a desired mass to charge ratio and energy exit along a path coincident with the mass-resolving slit 32. The emergent ion beam is then transported to the process chamber 40 where the target is located, i.e. the substrate wafer 12 to be implanted or a beam stop 38 when there is no wafer 12 in the target position. In other modes, the beam may also be accelerated or decelerated using a lens assembly positioned between the mass analysis stage 30 and the wafer position.

The semiconductor wafer 12 is mounted on a wafer holder 36, wafers 12 being successively transferred to and from the wafer holder 36, for example through a load lock (not shown).

The ion implanter 10 operates under the management of a controller, such as a suitably programmed computer 50. The computer 50 controls scanning of the wafer 12 through the ion beam 34 to effect desired scanning patterns. These scanning patterns may comprise raster scans, including interlaced patterns, as is well known in the art.

Figure 4:
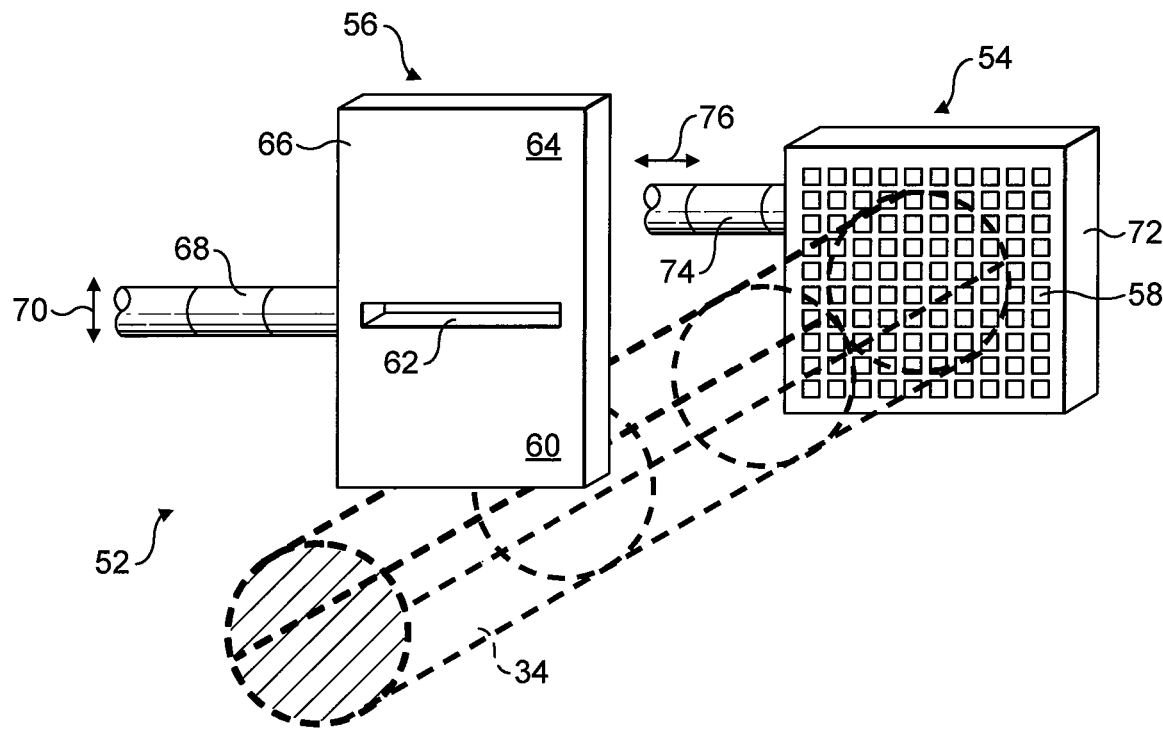
FIG. 4 is a schematic view in perspective of an occluding element and Faraday array according to the present invention.

FIG. 4 shows a first apparatus 52 for measuring the ion beam 34 in an ion implanter 10 like that shown in FIG. 3. The apparatus 52 comprises a Faraday array 54 positioned in the ion beam 34 downstream of an occluding element 56. The Faraday array 54 comprises a two-dimensional array of sensor elements 58 that face the ion beam 34, the sensor elements 58 being arranged into rows and columns. Each sensor element 58 measures the ion beam current incident thereon. That current will vary as the occluding element 56 is driven through the ion beam 34.

Measurements begin with a lower portion 60 of the occluding element 56 completely obscuring the ion beam 34 such that the Faraday array 54 receives no ions. The occluding element is then driven vertically such that a horizontal aperture 62, wider than the ion beam 34, is driven through the ion beam 34. The occluding element 56 is driven downwards until the aperture 62 is clear of the ion beam 34, such that the ion beam 34 is once more totally obscured, this time by an upper portion 64 of the occluding element 56.

A more detailed description of the parts shown in FIG. 4 is presented below, but now a description of the properties of the ion beam 34 that may be measured with the apparatus 52 of FIG. 4 is presented.

When used alone, the Faraday array 54 may be used to obtain a profile of the current across the ion beam 34 at the plane of Faraday array 54. For example, the current measurement taken by each sensor element 58 may be presented graphically to show such a profile. The resolution of the profile will depend upon the spacing between sensor elements 58 in the Faraday array 54. Further computation may be performed to extract further data, for example interpolation may be used to infer a contour plot of the ion beam current profile from the array of data points provided by the sensor elements 58. When data is being taken to determine the current profile at the plane of the Faraday array 54, the occluding element 56 is held clear of the ion beam 34.

Of course, the profile of the ion beam 34 at the plane of the occluding element 56 is projected to the plane of the Faraday array 54. As a result, driving the occluding element 56 through the ion beam 34 and observing changes in the projected image using the Faraday array 54 is a way of determining information about the ion beam 34 at the plane of the occluding element 56. In addition, as the geometry of occluding element 56 relative to the Faraday array 54 will be known, angular information may be deduced such that other properties like the divergence and emittance of the ion beam 34 may be deduced.

Figure 5:
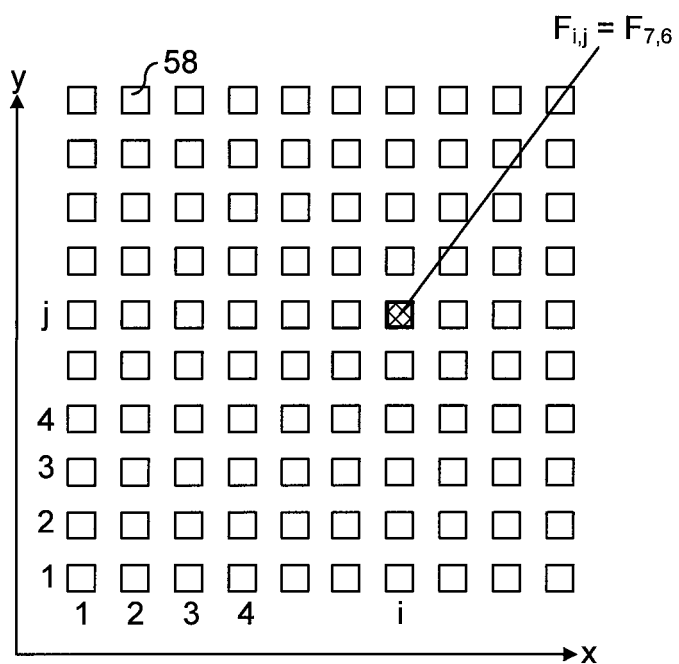
FIG. 5 is a schematic view of the sensor elements of the Faraday array of FIG. 4 indicating a labelling convention used in this description.
Figure 6:
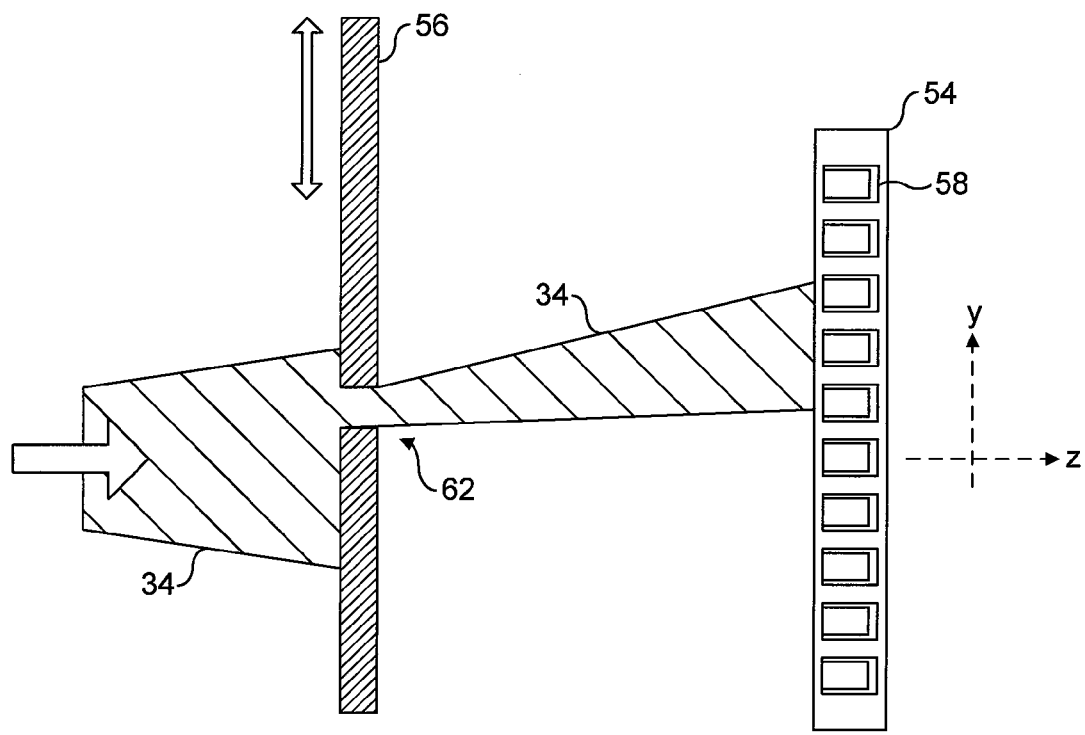
FIG. 6 is a section through the apparatus of FIG. 4 showing divergence of the beamlet emerging through an aperture of the occluding element.

FIG. 5 shows the arrangement of sensor elements 58 of the Faraday array 54 of FIG. 4 into rows and columns, each row having ten sensor elements 58 and each column having ten sensor elements 58. The array of 10×10 sensor elements 58 is merely an example, and greater or fewer sensor elements 58 may be used in the Faraday array 54. Of course, the resolution achievable depends upon the number of sensor elements 58 and their separation. Each sensor element 58 will be identified as $F_{i,j}$ where i refers to the column number and j refers to the row number. $F_{1,1}$ is the bottom left sensor element 58 and, hence, $F_{10,10}$ is the top right sensor element 58. In FIG. 6, sensor element $F_{7,6}$ is highlighted.

FIG. 6 shows the occluding element 56 in position partway along its motion through the ion beam 34. The occluding element 56 obscures the ion beam except for a portion that passes through the aperture 62, as shown. FIG. 6 corresponds to a poor ion beam 34, where the divergence and confusion have been exaggerated for the purposes of illustration. Hence, the collection of beamlets that emerge from the aperture 62 diverge due to the spread of angles of ions travelling relative to the z axis, and is incident upon more than a single row j of sensor elements 58 in the Faraday array 54. The larger the emittance of the ion beam 34, the wider the collection of beamlets. As the occluding element 56 is driven through the ion beam 34, the emerging beamlets will also scan down across the Faraday array 54. In addition, the aperture 62 is sampling the ion beam 34 at different y positions (the y axis corresponding to the vertical), and so the shape of the emerging beamlets will change as the emittance varies across the ion beam 34.

Returning to the use of the occluding element 56 and the Faraday array 54 to determine the profile of the ion beam current at the plane of the occluding element 56, this may be determined as follows. Measurements are taken from the sensor elements 58 at a series of successive measurement positions as the aperture 62 is driven down through the ion beam 34. The measurements for all sensor elements 58 is summed at each measurement position as $I(y)=\Sigma_j \Sigma_i I_{i,j}(y)$ to give the total ion beam current for the sampled portion of the ion beam 34 emerging through the aperture 62 at that measurement position.

A corresponding operation can be performed while driving horizontally an occluding element having a vertical aperture. Alternatively, the occluding element 56 may be made larger such that both a horizontal and a vertical aperture are provided therein. Whichever arrangement is used, driving the vertical aperture horizontally through the ion beam 34 while taking measurements provides I(x), the x-profile of the ion beam's current. Suitably combining the x- and y-profiles provides an indication of the overall profile of the ion beam current at the plane of the occluding element 56.

Figure 1:
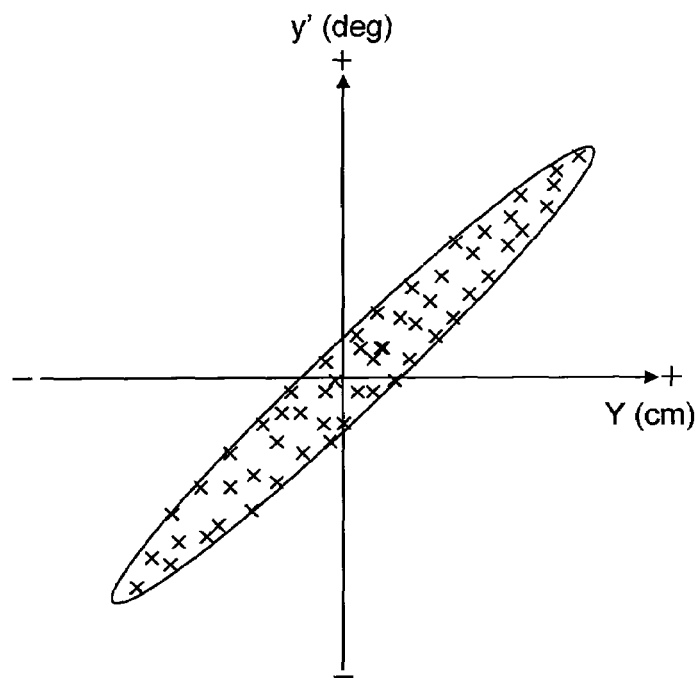
FIG. 1 is a graph showing the emittance of a diverging ion beam.

As mentioned above, scanning the aperture 62 through the ion beam 34 whilst measuring the current received by the Faraday array 54 provides angular information. The information obtained in such a scan may be used to provide an emittance plot like that shown in FIG. 1 or 2. For example, the occluding element 56 may be driven through the ion beam 34 with measurements being taken by the Faraday array 54 at a series of measurement positions. At each position, the sensor elements 58 receiving a current are identified. The rows j of sensors may be grouped together, i.e. a current in any sensor of a row j flags that row as receiving a portion of the ion beam 34.

As the dimensions of the occluding element 56, including the position of the aperture 62, are known and the position of the occluding element 56 may be determined using an encoder or the like (or any other well-known technique), the position y in the ion beam 34 being sampled by the aperture 62 at each measurement position may be determined. Also, the position and geometry of the Faraday array 54 is known, such that the angle relative to the z axis between any row of sensor elements 58 receiving current and the present aperture position may be found. In this way, a series of points may be found relating ion beam position y (i.e. where the aperture 62 was) to an angle y' (i.e. determine geometrically the angle of each row j of sensor elements 58 receiving current). The values obtained in this way may be plotted as per FIG. 1 to show the emittance of the ion beam 34. Just using the topmost and bottommost row of sensor elements 58 receiving ion beam current for each aperture position would also provide much the same information.

In addition, the current values recorded by each sensor element 58 in a row j may be summed as $I_j(y)=\Sigma_i I_{i,j}(y)$ and used to provide intensity information as well as angular information. Hence, a contour plot showing emittance and intensity like that of FIG. 2 may be obtained.

Similar techniques may be employed when driving an aperture horizontally, such that emittance plots for the x-direction are obtained (i.e. x' against x).

Now that techniques for determining properties of an ion beam 34 associated with the present invention have been described, further details of apparatus that may be used to implement these techniques will now be described.

Returning to FIG. 4, a first apparatus 52 is shown for measuring an ion beam 34. As described above, the apparatus 52 comprises a Faraday array 54 positioned in the path of the ion beam 34 downstream of an occluding element 56 provided with an aperture 62.

The occluding element 56 comprises a screen 66 mounted on a support arm 68. Although not shown, support arm 68 is mounted to an actuator that allows the screen 66 to be moved vertically, as indicated by the arrow 70. Hence, the actuator can be used to drive the screen 66 vertically through the ion beam 34. The screen 66 is provided with the aperture 62 through its centre.

The Faraday array 54 comprises a sensor head 72 mounted on a support arm 74. The support arm 74 is connected to an actuator (not shown) that allows the sensor head 72 to be moved horizontally into and out from the ion beam 34 as indicated by the arrow 76. The sensor head 72 is provided with the array of sensor elements 58 arranged in the regular array of ten rows and ten columns described above. As can be seen from FIG. 4, the array of sensor elements 58 is slightly larger than the expected ion beam 34. As a result, some of the sensor elements 58 should be "dark" at all times, particularly those in the corners of the array.

As will be appreciated, the occluding element 56 of FIG. 4 allows a measurement of the ion beam 34 along one direction only, the vertical. As mentioned above, measurements along the horizontal may also be effected, for example by providing a vertical aperture either on the screen 82 or on a separate occluding element. Of course, the associated actuator would require an ability to drive the screen with the vertical aperture horizontally through the ion beam 34.

Figure 7:
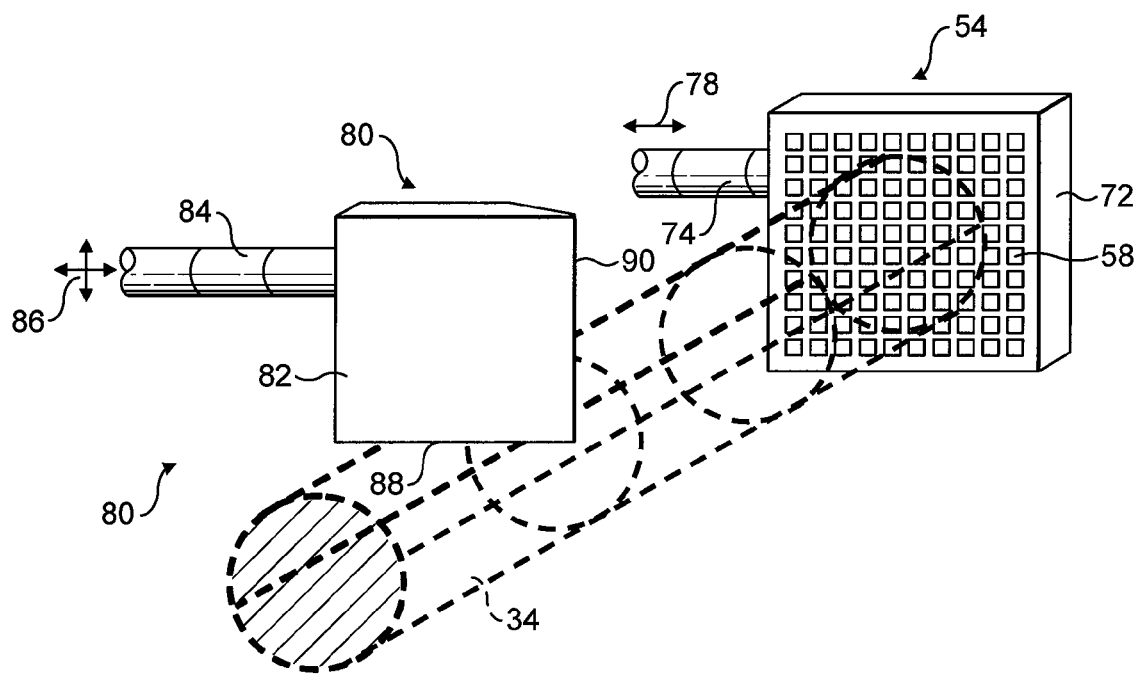
FIG. 7 is a schematic view in perspective of a further embodiment of an occluding element according to the present invention.

FIG. 7 shows apparatus 78 according to a further embodiment of the present invention that includes an alternative occluding element 80. The other parts are the same as for the embodiment shown in FIG. 4, and like reference numerals are used for like parts.

The occluding element 80 comprises a block 82 mounted on a support arm 84 that is in turn mounted on an actuator (not shown). The actuator moves the screen horizontally and vertically as indicated at 86. Measurements are taken by driving the block 82 progressively through the ion beam 34, horizontally for profiles in the x-direction, and vertically for profiles in the y-direction. In this way, the occluding element 80 casts a shadow that moves progressively over the Faraday array 54. To ensure a sharp and linear edge to the shadow, the block 82 is provided with a tapering horizontal edge 88 on its bottom and a tapering vertical edge 90 on its right side. Hence, lower edge 88 forms the leading edge as the occluding element 80 is driven downwards through the ion beam 34, and right edge 90 forms the leading edge as the occluding element 80 is driven to the right through the ion beam 34.

Figure 8:
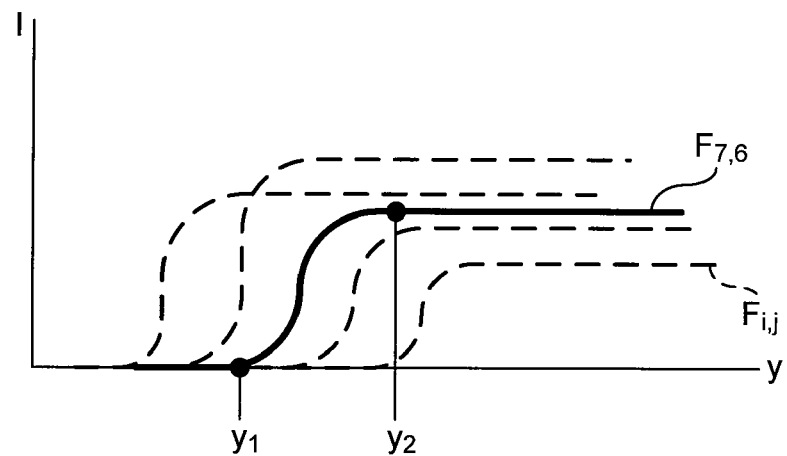
FIG. 8 is a graph showing typical current readings from sensor elements used in conjunction with the apparatus of FIG. 7.

FIG. 8 shows how the current I measured by different sensor elements 58 varies as the position y of the edge 88 is varied. Looking at the solid line corresponding to the current I measured by sensor element $F_{7,6}$ shown in FIG. 5, for high y values (i.e. where the occluding element 80 is held above the ion beam 34), the current I is initially high. The current I remains high as the edge 88 is lowered and y decreases until the edge 88 reaches position $y_2$ and starts to occlude the beamlet 92 reaching sensor element $F_{7,6}$. Once $y_2$ is reached, the current I falls slowly at first, but then increasingly quickly as the edge 88 approaches mid-point y. The current I then falls, but decreasingly quickly as the edge 88 approaches $y_2$ and so occludes all ions in beamlet 92 at which point the current I reaches zero (or, more likely, a base noise level corresponding to the dark current of the sensor element). The current I remains at zero as the edge 88 is driven further downwards.

As shown in FIG. 8, the curves obtained for different sensor elements $F_{i,j}$ differ according to their position. For example, a sensor element 58 located higher in the array, say $F_{7,9}$, will receive a lower current initially (the ion beam's current is greatest at its centre) and will start to fall at a higher y value. Conversely, a sensor element 58 closer to the centre of the ion beam 34, say $F_{7,4}$, will have a higher current initially and will only start to fall at a lower y value. Sensor elements 58 to the left and right along a row j will see a decrease in the current I they measure at the same y value, but their initial current value will vary according to their closeness to the centre of the ion beam 34.

The same information on the profile of the ion beam at the plane of the occluding element 80 may be obtained for occluding elements 56,80 having an aperture 62 or edges 88, 90. This is most easily realised by considering a method where the above occluding element 80 is moved vertically upwards to uncover progressively the ion beam 34. Suppose an initial position is chosen that totally obscures the ion beam 34, and the occluding element 80 is then moved a short distance upwards to a first measuring position. The occluding element 80 has revealed a small portion of the ion beam 34 at its bottom. In effect, this is the same as placing the aperture 62 at this bottom position and hence the measurements may be used exactly as for the aperture 62 case.

If the occluding element 80 is moved a small distance upwards to a second measuring position, slightly more of the ion beam 34 is revealed to the Faraday array 54. However, if the measurements from the previous measuring position are subtracted, the remainder corresponds to the contribution from the small portion of ion beam 34 revealed during the movement from first to second measuring position. This corresponds to the aperture 62 being placed at this small portion, and so the information may be used in the same way. Of course, this procedure can be repeated for each measuring position such that the aggregate values from the previous measuring positions are subtracted. Hence, by adding a subtraction step at each measuring position, the same information may be obtained using the occluding element 80 with edges 88, 90 as with using the occluding element 56 with aperture 62.

Although it is easier to understand from the perspective of progressive uncovering of the ion beam 34, the method also works with progressive covering of the ion beam 34 as will be described below.

Figure 9:
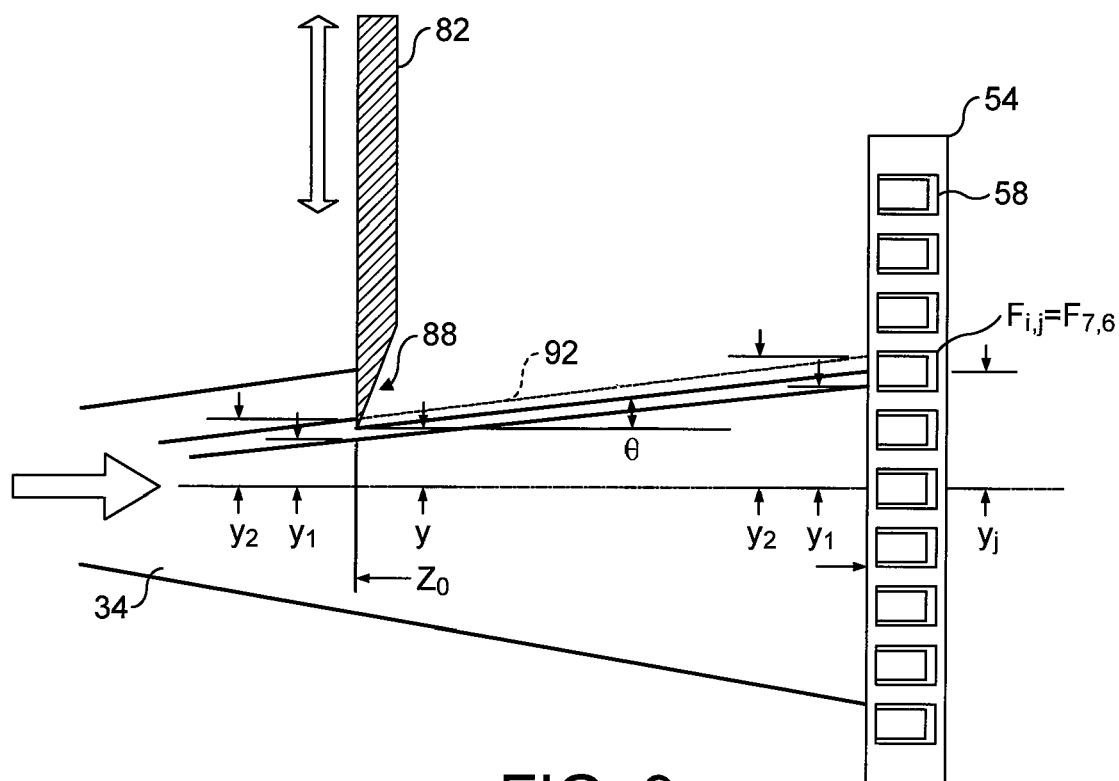
FIG. 9 is a section through the apparatus of FIG. 7 showing geometrical relationship used to determine angles of divergence in the ion beam.

FIG. 9 is a section along the length of the ion beam 34, and shows the occluding element 80 with its horizontal edge 88 driven part-way into the ion beam 34. FIG. 5 also shows a geometrical construction illustrating the beamlet 92 of the ion beam 34 that reaches sensor element $F_{7,6}$ shown in FIG. 5. Of course, this construction applies generally to any sensor elements $F_{i,j}$. The mid-point of sensor element $F_{i,j}$ is at a vertical height $Y_j$ above the centre of the ion beam 34 and has upper and lower edges at heights $Y_2$ and $Y_1$ respectively. The horizontal edge 88 is shown at a vertical position y where it casts a shadow to the mid-point $Y_j$ of the sensor element $F_{i,j}$. Two further positions of the horizontal edge 88 are defined: $y_2$ where the edge 88 just starts to occlude ions in the beamlet 92 that would otherwise reach sensor element $F_{i,j}$; and $y_1$ where the edge 88 occludes the last of the ions in beamlet 92.

To determine the profile of the ion beam current at the plane of the occluding element 80, measurements are taken from the sensor elements 58 at a series of successive positions as the occluding element 80 is driven down through the ion beam 34. The measurements for all sensor elements 58 are summed as $I(y)=E_j E_i I_{i,j}(y)$ to give the total ion beam current. The difference between successive values of this total current represents the current occluded by the last movement of the occluding element 80. Thus, differentiating the total current, $$\frac{dI(y)}{dy},$$

gives the y-profile of the ion beam's current at the plane of the occluding element 80. The same operation can be performed while driving the occluding element horizontally to obtain $$\frac{dI(x)}{dx}$$

and hence the x-profile of the ion beam's current. Suitably, combining the x- and y-profiles provides an indication of the overall profile of the ion beam current.

The angle 2 shown in FIG. 9 is given by $$\theta = \arctan\left(\frac{Y_j - y}{Z_0}\right) = \arctan\left(\frac{(Y_2 + Y_1) - (y_2 + y_1)}{2Z_0}\right)$$

and so the Faraday array 54 may be used to determine the divergence or convergence of each beamlet 64. Combining the angles of each beamlet 64 for a given position y in the ion beam 34 allows the emittance to be determined.

In practice, measurements are taken from the sensor elements 58 at successive positions as the occluding element 80 is driven down through the ion beam 34. For each position, the measurements from the sensor elements 58 within each row j are summed to provide ten row currents $I_j(y) = \Sigma_i I_{i,j}(y)$. It is the non-zero differences in the row currents $I_j(y)$ between successive measuring positions that indicate ions are being received by that row j of sensor elements 58 at the latest measuring position y, and hence allows the angle 2 for that row j to be associated with the position y. Hence, differentiating each row current $I_j(y)$ as $$\frac{d I_j(y)}{dy}$$

gives the angular distribution of the ion beam 64 for each position y in the ion beam. Plotting 2 (as y') against y allows an emittance plot like that of FIG. 1 to be realised.

As will be appreciated, a similar exercise may be performed while driving the vertical edge 90 horizontally through the ion beam 34 to obtain $$\frac{d I_i(x)}{dx}$$

and hence an x-profile of the angular distribution of the ion beam 34.

Treating the measurements from each sensor element 58 in a row separately $$\left(\text{i.e. differentiate to obtain } \frac{d I_{i,j}(y)}{dy} \text{ and } \frac{d I_{i,j}(x)}{dx}\right)$$

allows a detailed picture of the emittance of the ion beam 34 to be obtained. In this case a separate value of the angle of beamlet 92 of each sensor element 58 is obtained.

Figure 2:
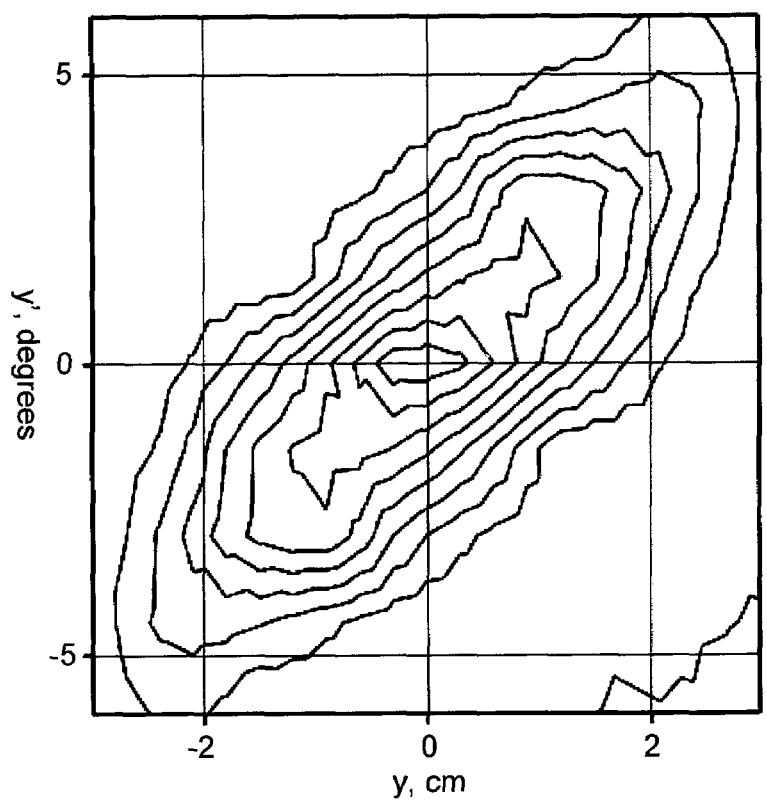
FIG. 2 is a contour plot showing the measured emittance of an ion beam.

In addition, a typical value of the current received at each sensor element 58 (or, if combined, each row of sensor elements 58) may be used to provide a contour plot like that shown in FIG. 2. For example, the peak current for each sensor element 58 (or row) may be used to show the intensity of the ion beam 34 in addition to the emittance in a plot against y (or x).

As described above, the Faraday array 54 may be used to provide a profile of the ion beam current at its plane, and so may be positioned at points of interest along the ion beam's path through the ion implanter 10. One favoured position is at the beam stop 38 provided at the back of the process chamber 40. As this is the last point on the ion beam's path, the Faraday array 54 need not be moved out of the ion beam 34 and so may be fixed in position. As a result, the support arm 74 and associated actuator may be omitted.

The occluding element 56 or 80 may be positioned at points of interest along the ion beam path through the ion implanter so as to measure the current profile or emittance at those positions. Favoured positions include at the plane of the wafer 12 adjacent the wafer support 36 and upstream of the mass-analysing magnet 30. For the former, a profile of the ion beam 34 at the plane of the wafer 12 may be obtained. Taking measurements at the latter allows the behaviour of the ion beam 34 through the mass-analysing magnet 30 to be investigated. Similarly, the occluding element 56 or 80 may be positioned upstream of any ion optics element to see how that element effects the ion beam 34.

Figure 10:
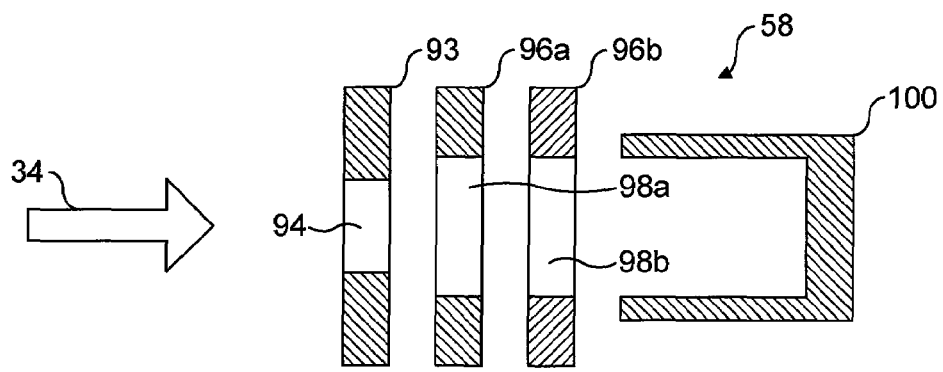
FIG. 10 is a section illustrating the parts forming each sensor element of the Faraday array of FIGS. 4 and 7.

FIG. 10 shows in more detail an arrangement that may be used for a sensor element 58. The sensor element comprises a front, ground plate 93 with an aperture 94, followed by a pair of electron suppression plates 96a,b also provided with apertures 98a,b. The electron suppression plates 96a,b suppress secondary electrons as is well known in the art. Finally, a Faraday cup 100 completes the sensor element 58. The apertures 94, 98a and 98b are aligned to provide line of sight between the ion beam 34 and the interior of the Faraday cup 100.

While separate sets of three plates 93, 96a and 96b may be provided for each sensor element 58 in the Faraday array 54 it is preferred to use three single plates 93, 96a and 96b to cover the entire array of sensor elements 58. Each single plate 93, 96a and 96b has a suitable array of apertures 94, 96a or 96b provided therein.

Figure 11:
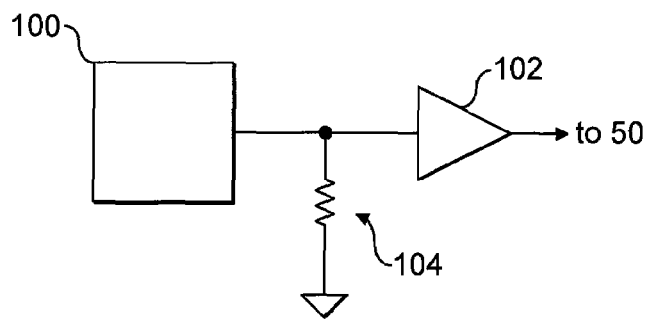
FIG. 11 is a schematic view showing a simple circuit for providing a signal from a sensor element.

FIG. 11 shows a simple electrical connection that may be used to link each sensor element 58 to the controller 50. The Faraday cup 100 is connected to the controller 50 via an amplifier 102. The path between Faraday cup 100 and amplifier 102 is also connected to ground via resistor 104. Other arrangements are of course possible. For example, ADC's may be included for each sensor element 58. Alternatively a single ADC or fewer ADC's may be used to operate on more than one sensor element 58. Multiplexers may also be used to allow serial rather than parallel processing of sensor element outputs.

As will be appreciated by those skilled in the art, variations may be made to the above embodiments without departing from the scope of the invention as defined by the claims.

For example, how the occluding element 56, 80 is moved may be varied. As will be clear, whether the occluding element 56, 80 is moved up or down, left or right is not critical. Furthermore the occluding element 56, 80 may be moved in other directions, although it is advantageous for two orthogonal directions to be used. Also, where an occluding element 56 is used such that an edge 88, 90 is driven through the ion beam 34, it does not matter whether this movement progressively occludes or uncovers the ion beam 34.

The Faraday array 54 need not be moved horizontally in and out of the ion beam 34; any other direction may be used. In fact, in some circumstances the Faraday array 54 need not be moved at all. For example, the Faraday array 54 may be used as the beam stop 38 that terminates the ion beam path, in which case the Faraday array 54 array 54 may be fixed in position.

Figure 12A:
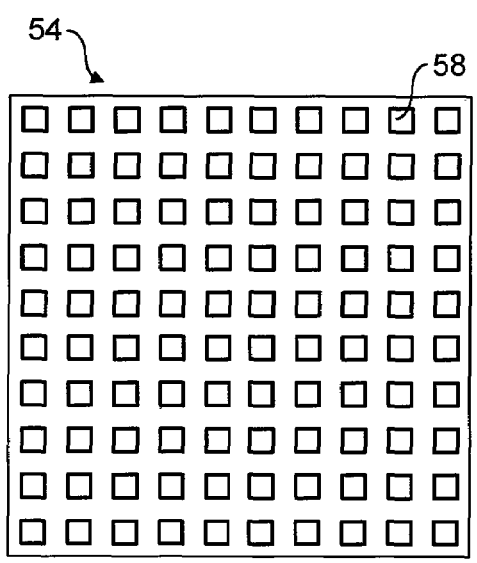
FIGS. 12a and 12b show two possible arrangements of sensor elements in a Faraday array according to the present invention.
Figure 12B:
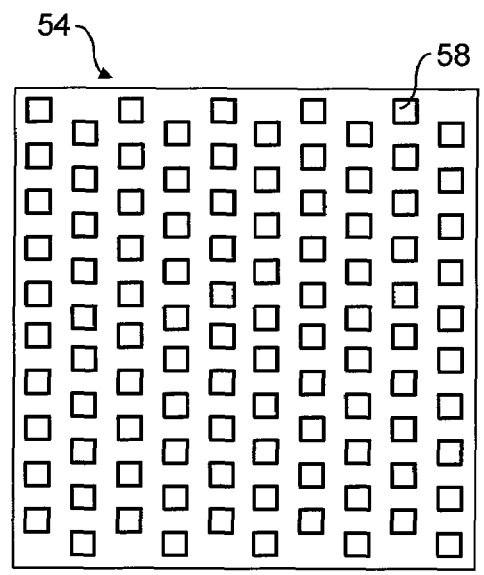

The above embodiments all employ Faraday arrays 54 having a regular array of sensor elements 58 arranged into rows and columns, as also shown in FIG. 12a. Other arrangements of the sensor elements 58 are possible, such as that shown in FIG. 12b. Here, the sensor elements 58 are arranged into staggered columns. Arrangements into other geometric patterns are possible (e.g. concentric circles), and different numbers of sensor elements 58 may be used.

The invention claimed is:

1. An ion implanter comprising:
an ion source operable to produce an ion beam;
ion optics operable to guide the ion beam along an ion beam path;
an array of sensors with an associated holder for holding the array of sensors in the ion beam path, each sensor being operable to measure an ion beam current incident thereon; wherein the array of sensors comprises a two-dimensional array, and the sensors are arranged linearly in rows and columns;
a moveable element positioned upstream of the array of sensors; and
an actuator arranged to move the moveable element across the ion beam path thereby to allow different portions of the ion beam to be revealed to the array of sensors as the moveable element cuts through the ion beam.

2. The ion implanter of claim 1, wherein the array of sensors comprises a linear array of sensors.

3. The ion implanter of claim 2, wherein the actuator is arranged to move the moveable element in the direction of the length of the linear array.

4. The ion implanter of claim 2, wherein the moveable element comprises an elongate aperture, elongate in a direction substantially normal to the length of the linear array.

5. The ion implanter of claim 2, wherein the moveable element comprises an edge presented so as to cut through the ion beam as the actuator moves the moveable element across the ion beam path.

6. The ion implanter of claim 5, wherein the edge is linear and aligned substantially normal to the length of the linear array of sensors.

7. The ion implanter of claim 1, wherein the moveable member is moveable both in the direction of the rows and the direction of the columns.

8. The ion implanter of claim 7, wherein the moveable element comprises a pair of elongate apertures, one aperture being elongate in the direction of the rows of sensors and the other aperture being elongate in the direction of the columns of sensors.

9. The ion implanter of claim 1, wherein the moveable element comprises an aperture elongate in the direction of the rows of sensors and the moveable element is moveable in the direction of the columns, and wherein the ion implanter comprises a further moveable element positioned upstream of the array of sensors, the further aperture comprising an aperture elongate in the direction of the columns and moveable in the direction of the rows.

10. The ion implanter of claim 7, wherein the moveable element comprises a pair of linear edges, one aligned with the rows of sensors and the other aligned with the columns of sensors, the edges being presented such that one edge cuts through the ion beam as the actuator moves the moveable element across the ion beam path in one direction and the other edge cuts through the ion beam as the actuator moves the moveable element across the ion beam path in the other direction.

11. The ion implanter of claim 1, wherein the array of sensors comprises an array of Faraday sensors.

12. The ion implanter of claim 1, further comprising a mass-analysing magnet, the moveable member being positioned upstream of the mass-analysing magnet and the array of sensors being arranged downstream of the mass-analysing magnet.

13. The ion implanter of claim 1, further comprising a quadrupole ion lens, the moveable member being positioned upstream of the quadrupole ion lens and the array of sensors being arranged downstream of the quadrupole ion lens.

14. A method of measuring an ion beam in an ion implanter comprising an ion source, ion optics, an occluding element and an array of sensors, the method comprising:
generating an ion beam using the ion source;
using the ion optics to guide the ion beam through the ion implanter to impinge on the array of sensors; wherein the array of sensors comprises a two-dimensional array and the sensors are arranged linearly in rows and columns;
moving the occluding element through the ion beam upstream of the array of sensors so as to allow different portions of the ion beam to reach the array of sensors; and
using each sensor to measure the ion beam current incident thereon at a series of known measuring positions of the occluding element in the ion beam.

15. The method of claim 14, wherein the array of sensors comprises a linear array, and the method comprises moving the occluding element through the ion beam in the direction of the length of the linear array.

16. The method of claim 15, wherein moving the occluding element comprises driving an elongate aperture of the occluding element though the ion beam, wherein the aperture is elongate substantially normal to the length of the linear array, the aperture allowing ions from a sampled portion of the ion beam to pass, and wherein measuring the ion beam current at each measuring position with each sensor provides current values for the sampled portion of the ion beam.

17. The method of claim 16, further comprising summing the current values for the sampled portion of the ion beam at each measurement position to obtain a series of total current values for the sampled portion of the ion beam at each measurement position.

18. The method of claim 17, further comprising presenting the series of total current values as a profile of the ion beam current at the plane of the occluding element.

19. The method of claim 16, comprising using the current values for the sampled portion of the ion beam at each measuring position to identify the sensors receiving current at each measuring position, and using a measured position of the occluding element to determine the angle of divergence or convergence of ions reaching each sensor receiving current.

20. The method of claim 19, further comprising presenting the determined angles for each measuring position as an emittance plot of the ion beam.

21. The method of claim 19, further comprising using the current values for the sampled portion of the ion beam from each sensor to present a contour plot of the emittance of the ion beam.

22. The method of claim 15, wherein moving the occluding element comprises driving an edge of the occluding element through the ion beam, wherein the edge is aligned substantially normal to the length of the linear array, the occluding element allowing ions from a fraction of the ion beam to pass, and wherein measuring the ion beam current at each measuring position with each sensor provides current values for the fraction of the ion beam.

23. The method of claim 22, comprising moving the occluding element to uncover progressively the ion beam, and subtracting the current values for the fraction of the ion beam obtained at the previous measuring position from the present measuring position thereby obtaining current values for a sampled portion of the ion beam corresponding to the portion of the ion beam uncovered by moving the occluding element from the previous measuring position to the present measuring position.

24. The method of claim 22, comprising moving the occluding element to cover progressively the ion beam, and subtracting the current values for the fraction of the ion beam obtained at the present measuring position from the previous measuring position thereby obtaining current values for a sampled portion of the ion beam corresponding to the portion of the ion beam covered by moving the occluding element from the previous measuring position to the present measuring position.

25. The method of claim 15, wherein the array of sensors comprises a series of linear arrays, each linear array forming a row of a two-dimensional array of sensors, the sensors being arranged into rows and columns, and wherein the method is repeated while moving the occluding element through the ion beam in the direction of the length of the columns of sensors thereby providing information on the ion beam both in the direction of the rows of sensors and the direction of the columns of sensors.

26. The method of claim 25, further comprising treating the two-dimensional array of sensors as a one-dimensional array when moving the occluding element by either (a) adding the current values received by the sensors in each row when the occluding element is being moved in the direction of the columns or (b) adding the current values received by the sensors in each column when the occluding element is being moved in the direction of the rows.

27. A controller for an ion implanter arranged to implement the method of claim 14.

28. A computer programmed to implement the method of claim 14.

29. An ion implanter comprising the controller of claim 27.

30. A computer program comprising program instructions that, when executed, cause an ion implanter to operate in accordance with the method of claim 14.

31. A computer readable medium carrying the computer program of claim 30.

32. An ion implanter comprising the computer of claim 28.

* * * * *